(12) United States Patent
Schier et al.

(10) Patent No.: US 12,037,675 B2
(45) Date of Patent: *Jul. 16, 2024

(54) METHOD FOR PRODUCING A COATED CUTTING TOOL AND A COATED CUTTING TOOL

(71) Applicant: WALTER AG, Tubingen (DE)

(72) Inventors: Veit Schier, Echterdingen (DE); Dominic Diechle, Herrenberg (DE)

(73) Assignee: Walter AG, Tubingen (DE)

( * ) Notice: Subject to any disclaimer, the term of this patent is extended or adjusted under 35 U.S.C. 154(b) by 1022 days.

This patent is subject to a terminal disclaimer.

(21) Appl. No.: 16/616,388

(22) PCT Filed: May 22, 2018

(86) PCT No.: PCT/EP2018/063296
§ 371 (c)(1),
(2) Date: Nov. 22, 2019

(87) PCT Pub. No.: WO2018/215408
PCT Pub. Date: Nov. 29, 2018

(65) Prior Publication Data
US 2020/0123647 A1    Apr. 23, 2020

(30) Foreign Application Priority Data
May 24, 2017 (EP) .................... 17172773

(51) Int. Cl.
*C23C 14/08* (2006.01)
*C23C 14/06* (2006.01)
*C23C 14/35* (2006.01)

(52) U.S. Cl.
CPC .......... *C23C 14/35* (2013.01); *C23C 14/0617* (2013.01); *C23C 14/08* (2013.01); *B23B 2228/10* (2013.01)

(58) Field of Classification Search
None
See application file for complete search history.

(56) References Cited

U.S. PATENT DOCUMENTS 8,025,991 B2 * 9/2011 Schier ............... C23C 14/08
                                                            428/701
11,104,987 B2 * 8/2021 Schier .............. C23C 14/081
(Continued)

FOREIGN PATENT DOCUMENTS

DE    102011053372 A1    3/2013
EP         2392688 A1   12/2011
(Continued)

*Primary Examiner* — Kim S. Horger
(74) *Attorney, Agent, or Firm* — Corinne R. Gorski

(57) ABSTRACT

A method for producing a coated cutting tool includes depositing a 0.5-10 μm nitride layer, which is a nitride of one or more of Ti, Zr, Hf, V, Ta, Nb, Si, Cr and Al, onto a substrate followed by depositing Al or Al+Me, further followed by depositing a 0.1-5 μm oxide layer being an $(Al_aMe_{1-a})_2O_3$ layer, $0.05 \le a \le 1$, wherein Me is one or more of Ti, Mg, Ag, Zr, Si, V, Fe, Hf, B and Cr, said layers being deposited by magnetron sputtering. Also, a coated cutting tool including a substrate with a coating having the nitride layer and oxide layer. The coating has inclusions of (Al,Me,O) in the oxide layer at the interface between the nitride layer and the oxide layer, and/or a layer of (Al,Me,O) situated in between the nitride layer and the oxide layer.

21 Claims, 1 Drawing Sheet

(56) References Cited

U.S. PATENT DOCUMENTS

| | | | |
|---|---|---|---|
| 2008/0286608 A1 | 11/2008 | Quinto et al. | |
| 2009/0252973 A1 | 10/2009 | Cremer | |
| 2010/0215975 A1* | 8/2010 | Yamamoto | C23C 14/0021 |
| | | | 427/527 |
| 2014/0193637 A1* | 7/2014 | Schier | C23C 14/08 |
| | | | 428/472 |

FOREIGN PATENT DOCUMENTS

| | | |
|---|---|---|
| WO | 2011036022 A1 | 3/2011 |
| WO | 2013083238 A1 | 6/2013 |

\* cited by examiner

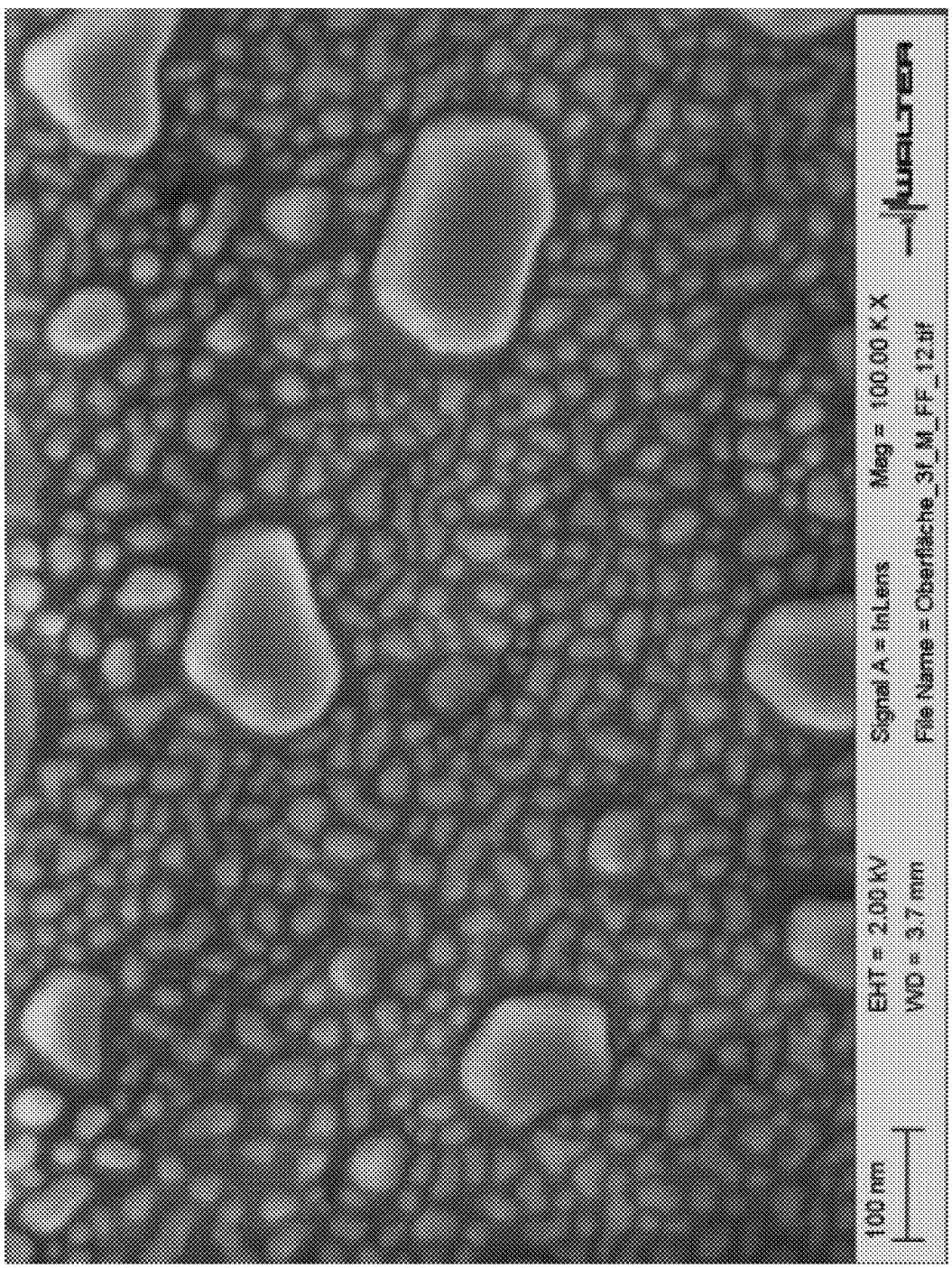

METHOD FOR PRODUCING A COATED CUTTING TOOL AND A COATED CUTTING TOOL

RELATED APPLICATION DATA

This application is a § 371 National Stage Application of PCT International Application No. PCT/EP2018/063296 filed May 22, 2018 claiming priority to EP 17172773.8 filed May 24, 2017.

The present invention relates to a method for producing a coated cutting tool having a coating comprising a metal nitride and an aluminum containing oxide. The present invention also relates to a coated cutting tool.

INTRODUCTION

There is a continuous desire to improve cutting tools for metal machining so that they last longer, withstand higher cutting speeds and/or other increasingly demanding cutting operations. Commonly, a cutting tool for metal machining comprises a hard substrate material such as cemented carbide which has a thin hard coating usually deposited by either chemical vapour deposition (CVD) or physical vapour deposition (PVD).

The coating frequently comprises a combination of two or more individual layers of different chemical composition. Apart from the importance of the adhesion between an innermost layer of the coating to the substrate material, one further important factor influencing the tool life is the adhesion between the individual layers within the coating.

Layer combinations of a metal nitride, for example (Ti, Al)N, and an oxide layer, such as aluminum oxide are known and generally give good cutting performance in various operations.

High toughness of the whole carbide tool is important. Depositing at higher temperatures results in reduced toughness of the carbide substrate. This results in higher risk of breakage. In order to keep the toughness of the substrate and the metal nitride layer sufficiently high one may want to deposit the oxide layer at comparatively low temperature. However, adhesion problems may then occur between the metal nitride layer and the oxide layer leading to shorter tool life.

The object of the present invention is therefore to overcome the above mentioned adhesion problems between a metal nitride layer and an aluminum-containing oxide layer and present a cutting tool with improved tool life.

BRIEF DESCRIPTION OF THE DRAWING

FIG. 1 is a top view of an SEM image of deposited islands.

THE INVENTION

It has now been provided a method for producing a coated cutting tool which provides a solution to the above-mentioned objective.

The method comprises depositing a 0.5-10 μm nitride layer which is a nitride of one or more of Ti, Zr, Hf, V, Ta, Nb, Cr, Si and Al, onto a substrate followed by depositing Al or Al+Me, further followed by depositing a 0.1-5 μm oxide layer being an $(Al_aMe_{1-a})_2O_3$ layer, $0.055 \leq a \leq 1$, Me is one or more of Ti, Mg, Ag, Zr, Si, V, Fe, Hf, B and Cr, said layers are deposited by magnetron sputtering.

Suitably, in the deposited Al or Al+Me, the atomic ratio Al/(Al+Me) is from 0.05 to 1, or from 0.1 to 1, or from 0.25 to 1, or from 0.5 to 1, or from 0.75 to 1.

The deposited Al or Al+Me may form a continuous layer or islands. By "islands" is herein meant separate areas of deposited Al or Al+Me, so that the underlying nitride layer is exposed. See FIG. 1 which is a top-view SEM image of deposited islands.

The deposited Al or Al+Me may also in some areas of the nitride layer form a continuous layer and in some areas of the nitride layer form islands as defined above.

In one embodiment, Al or Al+Me is deposited forming islands covering at least 25% of the nitride layer area, or at least 50% of the nitride layer area, or at least 75% of the nitride layer area.

The width of the islands may be up to about 300 nm, in their longest extension in a direction parallel to the surface plane. The average width of the islands, in their longest extension in a direction parallel to the surface plane, may be from 2 to 200 nm, or from 5 to 100 nm, or from 5 to 80 nm, or from 10 to 60 nm, suitably measured over an area of at least 1 (μm)².

The thickness of the islands may be from 2 to 200 nm, or from 5 to 150 nm, or from 10 to 100 nm.

The aspect ratio width to thickness of the islands is suitably from 1 to 50, or from 5 to 25.

For a continuous layer of Al or Al+Me deposited, the thickness of the Al or Al+Me layer may be from 2 to 200 nm, or from 5 to 150 nm, or from 10 to 100 nm.

In one embodiment the substrate temperature during the magnetron sputtering is from 350 to 600° C., or from 400 to 500° C.

In one embodiment, Al or Al+Me is deposited forming islands covering at least 25% of the nitride layer area, or at least 50% of the nitride layer area, or at least 75% of the nitride layer area.

For a continuous layer of Al or Al+Me deposited, the thickness of the Al or Al+Me layer may be from 2 to 200 nm, or from 5 to 150 nm, or from 10 to 100 nm.

In one embodiment the substrate temperature during the magnetron sputtering is from 350 to 600° C., or from 400 to 500° C.

In one embodiment the magnetron sputtering is High Power Impulse Magnetron Sputtering (HIPIMS).

For the deposition of the nitride layer with HIPIMS the DC bias voltage is suitably 20-100 V, or 30-75 V.

The maximum local peak power density during a pulse used in the HIPIMS process in the deposition of the nitride layer is suitably more than 100 W·cm$^{-2}$, or more than 500 W·cm$^{-2}$, or more than 900 W·cm$^{-2}$.

The maximum local peak current density during a pulse used in the HIPIMS process in the deposition of the nitride layer is suitably more than 0.4 A·cm$^{-2}$, or more than 0.8 A·cm$^{-2}$, or more than 1.2 A·cm$^{-2}$.

For the deposition of the nitride layer with HIPIMS the average power density is suitably 20-100 W·cm$^{-2}$, or 30-75 W·cm$^{-2}$.

For the deposition of the Al or Al+Me layer with HIPIMS the unipolar bias voltage is suitably 20-200 V, or 50-175 V, or 75-150 V.

For the deposition of the Al or Al+Me layer with HIPIMS the average power density is suitably 2-25 W·cm$^{-2}$, or 5-15 W·cm$^{-2}$.

For the deposition of the oxide layer with HIPIMS the unipolar bias voltage is suitably 20-400 V, or 50-200 V, or 75-150 V.

The maximum local peak power density during a pulse used in the HIPIMS process in the deposition of the oxide layer is suitably more than 50 W·cm$^{-2}$, or more than 100 W·cm$^{-2}$, or more than 200 W·cm$^{-2}$.

For the deposition of the oxide layer with HIPIMS the average power density is suitably 5-150 W·cm$^{-2}$, or 10-60 W·cm$^{-2}$.

The maximum local peak current density during a pulse used in the HIPIMS process in the deposition of the oxide layer is suitably more than 0.2 A·cm$^{-2}$, or more than 0.4 A·cm$^{-2}$, or more than 0.6 A·cm$^{-2}$.

The pulse length used in the HIPIMS process in both the deposition of the nitride layer and the deposition of the oxide layer is suitably from 2 µs to 200 ms, or from 10 µs to 100 ms.

The nitride layer can be represented by the general formula $Ti_bZr_cHf_dV_eTa_fNb_gCr_hSi_iAl_jN$, wherein $0 \leq b \leq 1$, $0 \leq c \leq 1$, $0 \leq d \leq 1$, $0 \leq e \leq 1$, $0 \leq f \leq 1$, $0 \leq g \leq 1$, $0 \leq h \leq 1$, $0 \leq i \leq 1$, $0 \leq j \leq 1$, $b+c+d+e+f+g+h+i+j=1$.

In one embodiment the nitride layer is a nitride of Al and one or more of Zr, Hf, V, Ta, Nb, Si and Cr, preferably a nitride of Al and one or more of Ti and Cr.

In one embodiment the nitride layer is a (Ti,Al)N layer of the general formula $Ti_bAl_{1-b}N$, wherein $0<b<1$, or $0.1<b<0.9$, or $0.2<b<0.7$, or $0.3<b<0.6$.

In one embodiment the nitride layer is a (Ti,Al,Cr)N layer of the general formula $Ti_bCr_hAl_{1-b-h}N$, wherein $0<b<1$, $0<h<1$, $0<b+h<1$. In one embodiment $0.1<b<0.9$ and $0.05<h<0.8$, or $0.2<b<0.8$ and $0.05<h<0.5$.

In one embodiment the nitride layer is an (Al,Cr)N layer of the general formula $Cr_hAl_{1-h}N$, wherein $0<h<1$. In one embodiment $0.2<h<0.8$, or $0.25<h<0.75$, or $0.25<h<0.35$.

Suitably, in the $(Al_aMe_{1-a})_2O_3$ layer $0.1 \leq a \leq 1$, or $0.25 \leq a \leq 1$, or $0.5 \leq a \leq 1$, or $0.75 \leq a \leq 1$, or $0.25 \leq a \leq 0.9$, or $0.25 \leq a \leq 0.7$.

In one embodiment the $(Al_aMe_{1-a})_2O_3$ layer is an $(Al_aCr_{1-a})_2O_3$ layer.

In one embodiment the $(Al_aMe_{1-a})_2O_3$ layer is an $Al_2O_3$ layer.

The $Al_2O_3$ layer is suitably of a gamma crystal structure.

The $(Al_aMe_{1-a})_2O_3$ layer is suitably of a gamma crystal structure.

It has now also been provided a coated cutting tool comprising a substrate with a coating comprising a nitride layer which is a layer of a nitride of Al and additionally one or more of Ti, Zr, Hf, V, Ta, Nb, Cr and Si, and an oxide layer (A) being an $(Al_aMe_{1-a})_2O_3$ layer, $0.05<a \leq 1$, situated above the nitride layer, wherein Me is one or more of Ti, Mg, Ag, Zr, Si, V, Fe, Hf, B and Cr, the coating has inclusions of (Al,Me,O), in the oxide layer (A) having an average atomic ratio (Al+Me)/O of equal to or more than ⅔, the inclusions starting from the interface between the nitride layer and the oxide layer (A) extending 2 to 200 nm in a direction towards the upper surface of the oxide layer (A), as determined from a cross-sectional cut, perpendicular to the surface plane, of the coating, and/or, a layer (B) of (Al,Me,O) having an average atomic ratio (Al+Me)/O of more than ⅔, and situated inbetween the nitride layer and the oxide layer (A), the thickness of the (Al,Me,O) layer (B) is from 2 to 200 nm.

In the inclusions of (Al,Me,O), as well as in layer (B), the atomic ratio Al/(Al+Me) is suitably from 0.05 to 1, or from 0.1 to 1, or from 0.25 to 1, or from 0.5 to 1, or from 0.75 to 1.

In one embodiment, the coating has in the interface region next to the nitride layer inclusions of (Al,Me,O) starting from the interface between the nitride layer and the oxide layer (A). The inclusions of (Al,Me,O) originates from deposited metallic Al or Al+Me islands which have been partly or fully oxidized during a deposition process of the oxide layer (A).

Thus, in one embodiment the inclusions of (Al,Me,O) has an average atomic ratio (Al+Me)/O of more than ⅔, i.e., a higher relative Al+Me content than in the remaining oxide layer.

In another embodiment the inclusions of (Al,Me,O) are fully oxidized. Thus, the inclusions of (Al,Me,O), has an average atomic ratio (Al+Me)/O of ⅔ and which are of another crystal structure than the remaining oxide layer (A). One example is that the remaining oxide layer (A) being of gamma crystal structure and the inclusions of (Al,Me,O) being of an alpha or kappa crystal structure.

The average width of the inclusions may be from 2 to 200 nm, or from 5 to 100 nm, or from 5 to 50 nm, or from 10 to 30 nm, as determined from a cross-sectional cut, perpendicular to the surface plane of the coating, suitably measured over a length of at least 1 µm.

The inclusions may extend 5 to 150 nm, or 10 to 100 nm, in a direction towards the upper surface of the oxide layer (A), as determined from a cross-sectional cut, perpendicular to the surface plane, of the coating.

In one embodiment the Al+Me content in the inclusions of (Al,Me,O) is in average from 40 to 100 at. %, or from 45 to 95 at. %, or from 50 to 75 at. %.

In one embodiment, the coating has a layer (B) of (Al,Me,O) situated inbetween the nitride layer and the oxide layer (A). The (Al,Me,O) layer (B) originates from a deposited metallic Al or Al+Me layer which has been partly oxidized during a deposition process of the oxide layer (A).

Thus, in one embodiment there exist a layer (B) of (Al,Me,O) which has an average atomic ratio (Al+Me)/O more than ⅔, i.e., a higher relative Al+Me content than in the above situated oxide layer (A).

The thickness of the layer (B) of (Al,Me,O) may be from 2 to 200 nm, or from 5 to 150 nm, or from 10 to 100 nm.

In one embodiment the Al+Me content in the layer (B) of (Al,Me,O) is in average >40 at. % and ≤100 at. %, or ≥45 at. % and ≤95 at. %, or ≥50 at. % and ≤75 at. %.

In one embodiment the coated cutting tool has in an 100 nm interface region next to the nitride layer in the direction towards the surface of the coating an average atomic ratio metal to oxygen, (Al+Me)/O of more than ⅔.

The interface region is herein defined to be the 100 nm part of the coating directly above the nitride layer.

In the interface region the average atomic ratio metal to oxygen (Al+Me)/O, is suitably more than 0.70, or more than 0.75.

The upper limit of the average atomic ratio metal to oxygen, (Al+Me)/O, in the interface region is suitably 0.85, or 0.80, or 0.75.

The thickness of the nitride layer is suitably 0.5-5 µm, or 1-4 µm.

The thickness of the oxide layer (A) is suitably 0.1-5 µm, or 0.3-3 µm, or 0.5-1 µm.

The nitride layer can be represented by the general formula $Ti_bZr_cHf_dV_eTa_fNb_gCr_hSi_iAl_jN$, wherein $0b \leq 1$, $0 \leq c \leq 1$, $0 \leq d \leq 1$, $0 \leq e \leq 1$, $0 \leq f \leq 1$, $0 \leq g \leq 1$, $0 \leq h \leq 1$, $0 \leq i \leq 1$, $0 \leq j \leq 1$, $b+c+d+e+f+g+h+i+j=1$.

In one embodiment the nitride layer is a nitride of Al and one or more of Zr, Hf, V, Ta, Nb, Si and Cr, preferably a nitride of Al and one or more of Ti and Cr.

In one embodiment the nitride layer is a (Ti,Al)N layer of the general formula $Ti_bAl_{1-b}N$, wherein $0<b<1$, or $0.1<b<0.9$, or $0.2<b<0.7$, or $0.3<b<0.6$.

In one embodiment the nitride layer is a (Ti,Al,Cr)N layer of the general formula $Ti_bCr_hAl_{1-b-h}N$, wherein $0<b<1$, $0<h<1$, $0<b+h<1$. In one embodiment $0.1<b<0.9$ and $0.05<h<0.8$, or $0.2<b<0.8$ and $0.05<h<0.5$.

In one embodiment the nitride layer is an (Al,Cr)N layer of the general formula $Cr_hAl_{1-b}N$, wherein $0<h<1$. In one embodiment $0.2<h<0.8$, or $0.25<h<0.75$, or $0.25<h<0.35$.

Suitably, in the $(Al_aMe_{1-a})_2O_3$ layer $0.1 \leq a \leq 1$, or $0.25 \leq a \leq 1$, or $0.5 \leq a \leq 1$, or $0.75 \leq a \leq 1$, or $0.25 \leq a \leq 0.9$, or $0.25 \leq a \leq 0.7$.

In one embodiment the $(Al_aMe_{1-a})_2O_3$ layer is an $(Al_aCr_{1-a})_2O_3$ layer.

In one embodiment the $(Al_aMe_{1-a})_2O_3$ layer is an $Al_2O_3$ layer.

The $Al_2O_3$ layer is suitably of a gamma crystal structure.

The $(Al_aMe_{1-a})_2O_3$ layer is suitably of a gamma crystal structure.

In one embodiment the oxide layer (A) is the uppermost layer of the coating.

In one embodiment the coating has a further layer on top of the oxide layer (A) for wear protection-, decorative- or wear recognition purposes. This uppermost layer has suitably a thickness of 0.1-10 μm and can for example be of nitrides such as TiN, (Ti,Al)N, CrN, HfN, carbides such as TiC, borides such as $TiB_2$ or oxides $(AlMe)_2O_3$, $ZrO_2$, $TiO_2$, $V_2O_5$ (including metallic interlayers) or multilayers of the forementioned.

The coating is suitably substantially free from droplets of target material on its surface.

The oxide layer (A) of the coating is preferably a PVD oxide layer, i.e., it has been deposited by a PVD process, preferably magnetron sputtering, most preferably HIPIMS.

The nitride layer of the coating is preferably a PVD nitride layer, i.e., it has been deposited by a PVD process, preferably magnetron sputtering, most preferably HIPIMS.

The substrate of the coated cutting tool can be of any kind common in the field of cutting tools for metal machining. Substrates include cemented carbide, cermet, cBN, ceramics, PCD and HSS.

In one embodiment, the substrate is cemented carbide having a composition of 6-12 wt % Co, optionally up to 10 wt % carbides or carbonitrides of one or more metals from groups 4, 5 and 6 in the periodic table of elements, and balance WC.

The metals from groups 4, 5 and 6 in the periodic table of elements are suitably belonging to the group of Ti, Ta, Nb, V, Zr, Cr, W and Mo.

The grain size of the WC, d, in the cemented carbide body is suitably 0.2-5 μm, or 0.5-2 μm. The grain size of the WC, d, is determined from the value of magnetic coercivity. The relationship between coercivity and grain size of WC is described, e.g., in Roebuck et al., Measurement Good Practice No. 20, National Physical Laboratory, ISSN 1368-6550, November 1999, Revised February 2009, Section 3.4.3, pages 19-20.

The coated cutting tool can be a coated cutting insert, such as a coated cutting insert for turning or a coated cutting insert for milling, or a coated cutting insert for drilling, or a coated cutting insert for threading, or a coated cutting insert for parting and grooving. The coated cutting tool can also be a coated solid drill, an endmill, or a tap.

In a preferred embodiment the coated cutting tool is a coated solid drill or coated endmill.

EXAMPLES

Example 1 (Invention)

Cemented carbide solid endmill blanks were provided having a composition of 10 wt % Co, 0.4 wt % Cr and balance WC.

The grain size of the WC, determined from coercivity, was about 0.5 μm.

Sample 1:

A (Ti,Al)N layer was deposited by HIPIMS using sequential power pulses provided according to the description in US 2014/0339917A1. The following process parameters/conditions were used:

Total pressure: 0.60 Pa
Ar-pressure: 0.43 Pa
N2-pressure: 0.17 Pa
Substrate temperature: 430° C.
Bias voltage: −40 V DC
Bias current: −4.1 A
Power: 27.8 kW on 3×Ti40Al60-targets
Target diameter: 160 mm
Average power density: 46.1 W·cm$^{-2}$
On-time of pulse: 7.56 ms
Pulse frequency: 20 Hz
Deposition time: 180 minutes The layer thickness was measured to 2.8 μm. The hardness of the deposited (Ti,Al,)N layer was measured to 3300HV0.015. The reduced E-modulus was measured to 450 GPa.

Further, metallic (Al,Cr) (minor amounts Cr due to a Cr-containing fringe on the Al-target used) was deposited by HIPIMS using sequential power pulses. The following process parameters/conditions were used:

Ar-pressure: 0.6 Pa (=total pressure)
Substrate temperature: 430° C.
Bias voltage: 100 V unipolar pulsed
Bias current: −0.2 A, +0.3 A
Bias on-time: 10 μs
Bias off-time: 10 μs
Power: 5 kW on 3× Al-targets (with Al50Cr50 fringe)
Target diameter: 160 mm
Average power density: 8.3 W·cm$^{-2}$
On-time of pulse: 50 ms
Pulse frequency: 6.67 Hz
Deposition time: 13 s The (Al,Cr) was present in the form of islands of thickness between about 2 and 20 nm on the (Ti,Al)N surface. FIG. 1 shows a top-view SEM image where the islands are seen.

Further an $(Al,Cr)_2O_3$ layer (slight content of Cr) was deposited by HIPIMS using sequential power pulses provided according to the description in WO2013083238A1. The following process parameters/conditions were used:

Total pressure: 0.72 Pa
Ar-pressure: 0.6 Pa
O2-pressure: 0.12 Pa
Substrate temperature: 430° C.
Bias voltage: 100 V unipolar pulsed
Bias current: −1.2 A, +1.3 A
Bias on-time: 10 μs
Bias off-time: 10 μs
Power: 10 kW on 3× Al-targets (with Al50Cr50 fringe)
Target diameter: 160 mm Average power density: 16.6 W·cm$^{-2}$
On-time of pulse: 50 ms
Pulse frequency: 6.67 Hz
Deposition time: 140 min The deposited (Al,Cr)$_2$O$_3$ layer was determined by XRD to be a gamma-Al$_2$O$_3$ layer. The layer thickness was measured to 0.65 μm. The hardness of the deposited (Al,Cr)$_2$O$_3$ layer was measured to 2800HV0.015. The reduced E-modulus was measured to 370 GPa.

Sample 2:
(Ti,Al)N/(Al,Cr)/(Al,Cr)$_2$O$_3$ were deposited using the same procedure as for Sample 1 but using half the power, 2.5 kW when depositing the (Al,Cr) layer. This achieved a smaller amount of (Al,Cr) deposited.

Sample 3:
(Ti,Al)N/(Al,Cr)/(Al,Cr)$_2$O$_3$ were deposited using the same procedure as for Sample 1 but using a longer deposition time (about 27 seconds) when depositing the (Al,Cr) layer. This achieved a greater amount of (Al,Cr) deposited.

Sample 4:
A comparative sample without any deposited metallic (Al,Cr) between the nitride and the oxide layer was made by using the same procedure for the deposition of the (Ti,Al)N layer and (Al,Cr)$_2$O$_3$ layer as for Sample 1.

The coated endmills were then tested in a milling operation in steel.
Work piece material: 1.2311 steel
Machine: Grob G550
V$_c$=140 m/min (cutting speed in meters per minute)
f$_z$=0.04 mm/tooth (feed rate in millimeter per tooth)
Liquid cooling
a$_p$=4.0 mm
a$_e$=10.0 mm The tool geometry for the solid round endmill was Walter Prototyp Protomax ST, diameter 10 mm, 4 flute, corner chamfer 0.1 mm. All tools used in this test were from the same production order.

The cut-off criteria for tool life is 75 μm wear on at least one of the main cutting edge and chamfer.

Table 1 shows the results:

TABLE 1

| | Wear at chamfer (μm) | Wear at main cutting edge (μm) | Total (milling) length |
|---|---|---|---|
| Sample 1 | 71.2 | 85.5 | 40 m |
| Sample 2 | 91.4 | 69.8 | 40 m |
| Sample 3 | 64.0 | 51.0 | 40 m |
| Sample 4 (comparative) | 75.7 | 77.3 | 30 m |

It is concluded that the coating that had been made without any deposition of any metallic (Al,Cr) between the nitride and the oxide layer (Sample 4) reached the cut-off criteria already after 30 m total milling length.

All samples with a coating that had been made including deposition of a metallic (Al,Cr) between the nitride and the oxide layer outperformed comparative Sample 4.

The invention claimed is:

1. A coated cutting tool comprising:
a substrate;
a coating disposed on the substrate, the coating comprising:
a nitride layer, which is a layer of a nitride and one or more of Ti, Zr, Hf, V, Ta, Nb, Cr, Si and Al, and an oxide layer being an (Al$_a$Me$_{1-a}$)$_2$O$_3$ layer, 0.05≤a≤1, situated above the nitride layer, wherein Me is one or more of Ti, Mg, Ag, Zr, Si, V, Fe, Hf, B and Cr, the coating having inclusions of (Al,Me,O) in the oxide layer, the inclusions starting from an interface between the nitride layer and the oxide layer extending 2 to 200 nm in a direction towards an upper surface of the oxide layer, as determined from a cross-sectional cut, perpendicular to the surface plane, of the coating, the Al+Me content in the inclusions of (Al,Me,O) is in average from 45 to 75 at. %; and/or
a layer of (Al,Me,O) having an average atomic ratio (Al+Me)/O of more than ⅔, situated in between the nitride layer and the oxide layer, a thickness of the (Al,Me,O) layer being from 2 to 200 nm, the Al+Me content in the layer of (Al,Me,O) is in average ≥45 at. % and ≤75 at. %.

2. The coated cutting tool according to claim 1, wherein the nitride layer is a (Ti,Al)N layer of the general formula Ti$_b$Al$_{1-b}$N, wherein 0<b<1.

3. The coated cutting tool according to claim 1, wherein in the (Al$_a$Me$_{1-a}$)$_2$O$_3$ layer 0.1≤a≤1.

4. The coated cutting tool according to claim 1, wherein the (Al$_a$Me$_{1-a}$)$_2$O$_3$ layer is an (Al$_a$Cr$_{1-a}$)$_2$O$_3$ layer.

5. The coated cutting tool according to claim 1, wherein the thickness of the nitride layer is 0.5-10 μm and the thickness of the oxide layer is 0.1-5 μm.

6. The coated cutting tool according to claim 1, wherein in an 100 nm region next to the nitride layer in a direction towards a surface of the coating has an average atomic ratio metal to oxygen, (Al+Me)/O, of more than ⅔.

7. The coated cutting tool according to claim 1, wherein in the (Al$_a$Me$_{1-a}$)$_2$O$_3$ layer 0.5≤a≤1.

8. A coated cutting tool comprising:
a substrate;
a coating disposed on the substrate, the coating comprising:
a nitride layer, which is a layer of a nitride and one or more of Ti, Zr, Hf, V, Ta, Nb, Cr, Si and Al, and an oxide layer being an (Al$_a$Me$_{1-a}$)$_2$O$_3$ layer, 0.05≤a≤1, situated above the nitride layer, wherein Me is one or more of Ti, Mg, Ag, Zr, Si, V, Fe, Hf, B and Cr, the coating having inclusions of (Al,Me,O) in the oxide layer, the inclusions starting from an interface between the nitride layer and the oxide layer extending 2 to 200 nm in a direction towards an upper surface of the oxide layer, as determined from a cross-sectional cut, perpendicular to the surface plane, of the coating, the Al+Me content in the inclusions of (Al,Me,O) is in average from 45 to 75 at. %.

9. A method for producing the coated cutting tool according to claim 1 comprising depositing a 0.5-10 μm nitride layer, which is the nitride of one or more of Ti, Zr, Hf, V, Ta, Nb, Cr, Si, and Al, onto the substrate followed by depositing Al or Al+Me, further followed by depositing a 0.1-5 μm oxide layer being the (Al$_a$Me$_{1-a}$)$_2$O$_3$ layer, wherein 0.05≤a≤1, and Me is one or more of Ti, Mg, Ag, Zr, Si, V, Fe, Hf, B and Cr, said layers being deposited by magnetron sputtering.

10. The method according to claim 9, wherein the substrate temperature during the magnetron sputtering is from 350 to 600° C.

11. The method according to claim 9, wherein the magnetron sputtering is High Power Impulse Magnetron Sputtering.

12. The method according to claim 9, wherein the deposited Al or Al+Me forms islands.

13. The method according to claim 9, wherein the Al or Al+Me is deposited forming islands covering at least 25% of the nitride layer.

14. The method according to claim 9, wherein the deposited Al or Al+Me forms a continuous layer.

15. The method according to claim 9, wherein the deposited Al or Al+Me in some areas of the nitride layer form a continuous layer and in some areas of the nitride layer form islands.

16. The method according to claim 12, wherein the average width of the islands is from 2 to 200 nm.

17. The method according to claim 14, wherein the thickness of the Al or Al+Me layer is from 2 to 200 nm.

18. The method according to claim 9, wherein the nitride layer is a (Ti,Al)N layer of the general formula $Ti_bAl_{1-b}N$, wherein $0<b<1$.

19. The method according to claim 9, wherein the $(Al_aMe_{1-a})_2O_3$ layer is an $(Al_aCr_{1-a})_2O_3$ layer.

20. The method according to claim 13, wherein the average width of the islands is from 2 to 200 nm.

21. The method according to claim 15, wherein the thickness of the Al or Al+Me layer is from 2 to 200 nm.

* * * * *